United States Patent [19]

Anderson et al.

[11] Patent Number: 5,714,268
[45] Date of Patent: Feb. 3, 1998

[54] COATED SOLAR PROTECTION GLAZING

[75] Inventors: Charles Edward Anderson, Courbevoie; Isabelle Wuest, Paris; Jacques Tabare, Presles, all of France; Guenther Termath, Gelsenkirchen, Germany

[73] Assignee: Saint-Gobain Vitrage International, Courbevoie, France

[21] Appl. No.: 608,207

[22] Filed: Feb. 28, 1996

Related U.S. Application Data

[63] Continuation of Ser. No. 643,866, Jan. 18, 1991, abandoned.

[30] Foreign Application Priority Data

Jan. 19, 1990 [FR] France ................... 90 00593

[51] Int. Cl.$^6$ ......................................... B32B 15/04
[52] U.S. Cl. .................. 428/432; 428/433; 428/469; 428/472; 428/701; 359/360; 359/580
[58] Field of Search ........................ 428/432, 433, 428/336, 469, 472, 697, 699, 701, 216; 359/359, 580, 586, 360; 65/60.4

[56] References Cited

U.S. PATENT DOCUMENTS

| | | | |
|---|---|---|---|
| 3,274,024 | 9/1966 | Hill et al. | 428/433 |
| 3,826,728 | 7/1974 | Chambers et al. | 428/433 |
| 3,878,079 | 4/1975 | Schauer | 204/192 |
| 4,045,125 | 8/1977 | Farges | 359/360 |
| 4,101,705 | 7/1978 | Fischer et al. | 428/437 |
| 4,322,276 | 3/1982 | Mecket et al. | 428/472 |
| 4,462,883 | 7/1984 | Hart | 428/621 |
| 4,702,955 | 10/1987 | Allred et al. | 428/701 |
| 4,749,397 | 6/1988 | Chesworth et al. | 65/60.4 |
| 4,773,717 | 9/1988 | Pai et al. | 359/580 |
| 4,965,121 | 10/1990 | Young et al. | 428/701 |
| 5,061,567 | 10/1991 | Brochot et al. | 428/216 |
| 5,085,926 | 2/1992 | Iida et al. | 359/359 |

FOREIGN PATENT DOCUMENTS

| | | | |
|---|---|---|---|
| 62123403 | 11/1985 | Japan. | |
| 63242948 | 3/1987 | Japan. | |
| 2126256 | 3/1984 | United Kingdom | 428/433 |

OTHER PUBLICATIONS

Chemical Abstracts, vol. 111, No. 2, Jul. 10, 1989, No. 15542q.

Chemical Abstracts, vol. 107, No. 10, Sep. 7, 1987, No. 82664j.

*Primary Examiner*—Timothy Speer
*Attorney, Agent, or Firm*—Pennie & Edmonds LLP

[57] ABSTRACT

A thin film for covering a clear or colored glass sheet to form a monolithic automobile glazing. The film is based upon metallic tantalum. It may be covered with a layer based upon oxides of various metals. The solar energy transmission and also the reflection of light through the glazing are low, whereas the reflectance is similar to that of the base glass.

24 Claims, 1 Drawing Sheet

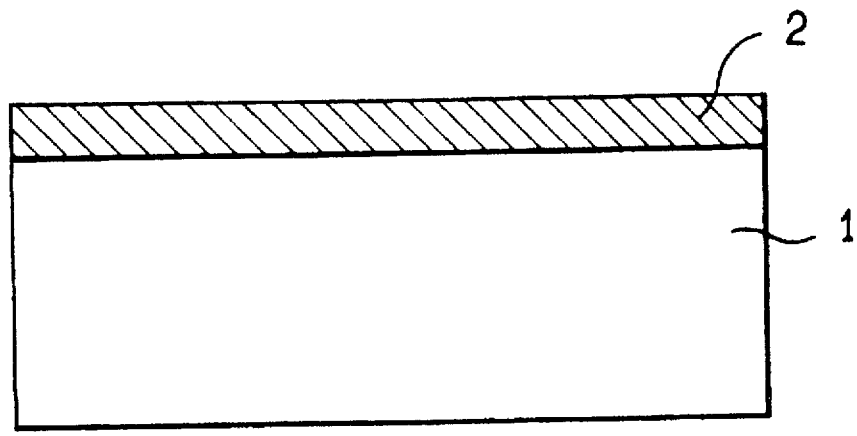
FIG_1
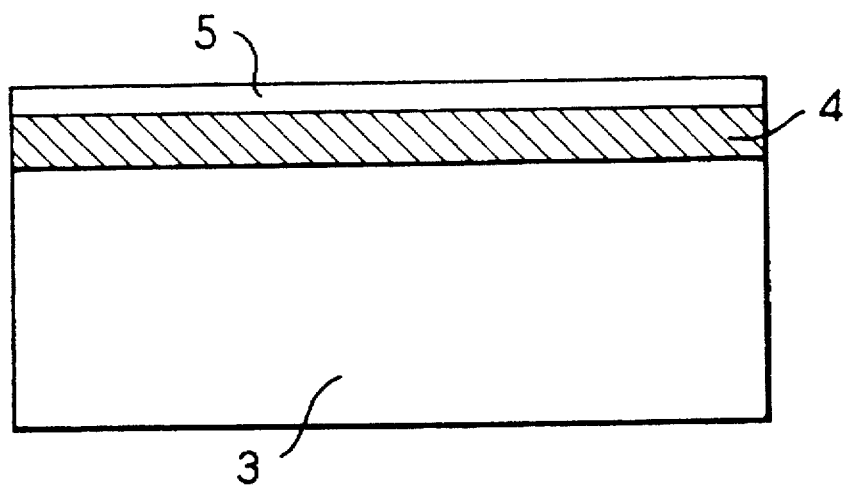
FIG_2

COATED SOLAR PROTECTION GLAZING

This is a continuation of application Ser. No. 07/643,866 filed Jan. 18, 1991, now abandoned.

TECHNICAL FIELD

The present invention relates to coated glass sheets and more particularly to glass sheets having at least one thin film coating deposited thereupon for reducing the amount of solar radiation passing therethrough and for protecting glazings from abrasion and the effects of humidity. Such coated sheets are particularly useful as motor vehicle glazings.

BACKGROUND OF THE INVENTION

In today's newer automobile models, the area and, frequently, the inclination of the glass panels used in these vehicles is becoming increasing larger. This permits a greater amount of solar energy to penetrate into the interior of the passenger compartment of vehicles which are so equipped. Consequently, the hot-weather comfort of such vehicles that are not equipped with air-conditioning is becoming an increasingly serious problem.

One method for improving this situation comprises providing the window panes other than the windshield of such automobiles with a thin film coating that absorbs a considerable portion of the incident solar radiation. Strict requirements exist, however, governing such coatings. For example, the coatings must have a limited coefficient of reflectivity, especially toward the exterior of the vehicle. Moreover, they must also have an excellent resistance to scratching and humidity. The coating of the present invention offers a decisive improvement with respect to these three criteria in comparison with presently existing coatings.

Among the techniques most commonly used for depositing thin films on glass, one group makes use of chemical deposition at high temperature, such as by pyrolysis or vapor phase chemical deposition (CVD), while the other group utilizes vacuum deposition methods. With the first group of techniques, there is usually a limit to the performance of the films thus obtained, because these products frequently have too low a ratio of visible light transmission to infrared light transmission. On the other hand, these high temperature techniques have the advantage of providing highly adherent films, typically with good abrasion resistance, which are very resistant to humidity. The results are different with the use of the vacuum deposition techniques since the optical performance of the films can be much more readily obtained. In contrast, however, the mechanical and/or chemical resistance of these films is not as good as those of the pyrolyzed coatings or those produced by CVD.

The automobile industry presently requires the use of thin glass panes in their vehicles in order to reduce the vehicles' overall weight. However, one requirement is that these panes pass only a small proportion of the incident solar energy, such as for example less than 30%, while still remaining sufficiently transparent to visible light with, for example, a light transmission exceeding 40%. These panes are intended to be fitted to the rear of such vehicles, resulting in a look known as the "dark tail" effect.

According to this concept, it is envisaged to have, in a single vehicle, glass panes in which the transmission of light would decrease by steps from the front windshield (the most transparent), to the forward side windows, then to the rear side windows and, finally, to the back window (the least transparent). This complies with the requirement for maximum visibility through the windshield (which must have a light transmission exceeding 75% according to the applicable regulations), while enhancing the anti-solar treatment on the other panes, for which the requirement concerning light transmission is less stringent. Moreover, since as noted above, for reasons of weight it is desirable to use glass panes having the smallest possible thickness, it would be necessary, in the case of a pane having the coloration incorporated within the glass, to utilize, on the one hand, a very dense coloration and, on the other hand, different degrees of coloration (four in the "dark tail" example described above). These two requirements are very difficult to achieve in practice.

Until now it has been impossible to manufacture flat glasses of good quality with the intrinsic absorption coefficients required. These products are generally limited to energy transmission, at a minimum, of the order of 45% with 4 mm thickness, and even these transmission levels are too high. This is why the only possible solution, when utilizing these support glasses, is to equip them with the most efficient film coatings, that is to say coatings applied under vacuum which provide the necessary absorption complement.

Under such circumstances, however, a new requirement arises, which is associated with the appearance of the pane as viewed from the outside. It is essential that this appearance, as with conventional absorbent glasses, be as neutral as possible and that it vary little in the different panes of the "dark tail".

Attempts have been made in this direction. Thus, for example, European Patent Application EP 0 374 000 A, which corresponds to U.S. Pat. No. 5,112,675, provides for coating glass sheets with a film of titanium carbide, which is itself covered with an overlying layer of indium-tin oxide. This combination provides a solar protecting coating. However, the reflectivity of the coated glass and the adhesion of the film to the glass does not entirely meet acceptable values. Moreover the resistance to humidity and abrasion, although very good, nevertheless do not reach the values of those of the glass.

It is also known to deposit a coating of tantalum onto a glass sheet. U.S. Pat. No. 4,773,717 describes a pane which possesses brilliant colors in reflection, with a high degree of purity. The colored effect is obtained by the combination of a metal film having a thick interferential film deposited over it. Tantalum is listed among the 9 metals which may be used to form the film.

In Japanese Patent JP 62-123-403, which does not concern a window pane, it is proposed that tantalum be used as a metal for forming a colored mirror, with the metal being protected on its rear face by anodizing. Adjustment of the anodization voltage enables the color of the mirror to be changed at will.

SUMMARY OF THE INVENTION

A primary object of the present invention is to provide a glass pane covered with a very absorbent thin film, the abrasion resistance and humidity resistance of which are almost as good as those of the glass alone.

It is a further object of the invention to produce a glass pane, i.e., a glazing (these terms are used interchangeably herein) which has properties compatible with use in automobiles, especially with regard to its optical reflection, resistance to abrasion and resistance to humidity.

The solar protection glazing of the invention comprises a glass substrate covered with a first and (optionally) a second thin film deposited atop the first film, wherein the first film, i.e., which is in contact with the glass, is formed of metallic tantalum. The second film, if present, is a metal oxide film having a thickness less than about 40 nm. The deposition technique is preferably cathodic sputtering utilizing magnetic confinement of the plasma, also known as "magnetic cathodic sputtering".

The first, i.e., tantalum-based film has a thickness of from 2 to 30 nm, i.e., from 4.5 to 6.5 and preferably 5 nm for a lateral automobile glazing and from 22 to 28 nm for an automobile roof.

Where the tantalum-based film is covered with a second film of a metal oxide, this film is formed from an oxide of one or more of the following metals: tin, indium, zinc, antimony, cadmium and tantalum. The thickness of this film is greater than about 10 nm and preferably greater than about 12 nm. The thickness of the tantalum-based film is the same whether it is deposited alone or with another layer.

In the case of a lateral glazing, the light transmission value ranges between about 0.30 and 0.75 with a $T_H/T_L$ ratio less than 0.70. In the case of a glazing used in an automobile roof, the light transmission is no greater than about 0.10.

The glass used to form the substrate may be, for example, a "standard" silicon-sodium-calcium glass, but other known glass compositions may also be used in place of this material. Preferably, the underlying glass substrate is colored and examples of such colored glasses include, but are not limited to those known in the art as TSA, TSA$^{++}$ and TFA glass. The composition of TSA glass, also known as "TSA Standard" glass, is well known to those of ordinary skill in the art. Its chemical composition is that of a silicon-sodium-calcium float glass, but with 0.57% by weight of $Fe_2O_3$, with a proportion of ferrous ions in relation to the total iron of 0.25%. TSA$^{++}$, which is a variation of the TSA formulation, contains several additives to provide coloration to the glass. The composition of this material is described in Example 1 below. TFA glass, also known as bronze glass, is described in U.S. Pat. Nos. 4,101,705 and 4,190,452, the disclosure of which is incorporated herein by reference. This material contains 0.56% $Fe_2O_3$ and 12 ppm of cobalt oxide, with the remainder comprising the "standard" silicon-sodium-calcium float glass materials. The proportion, i.e., ratio of ferrous ions to total iron in the TFA material is 0.19.

Applicants' invention thus makes it possible, by means of at least one simple metal film that can be deposited very rapidly, to obtain a coated glass pane, the reflection of which on the glass side is of the same order as that of the glass alone and which is highly resistant to abrasion. This scratch resistance is still further improved if the first, i.e., tantalum, coating is covered with a second metal oxide coating which noticeably improves the humidity resistance.

The invention also makes it possible, using the same methods, to obtain a roof glazing having a similar appearance and the same abrasion and humidity resistance.

BRIEF DESCRIPTION OF THE DRAWINGS

FIG. 1 schematically illustrates a tantalum coating supported upon a glass pane;

FIG. 2 illustrates the tantalum coating of FIG. 1 protected by an oxide coating.

DETAILED DESCRIPTION OF THE INVENTION

The deposition technique used in the present invention for applying the coating to the glass pane is preferably cathodic sputtering with magnetic confinement of the plasma, i.e., magnetic cathodic sputtering, as described for example in U.S. Pat. Nos. 4,166,018 and 4,116,806 the disclosures of which are expressly incorporated herein by reference.

The invention will be better understood by the following examples given by way of illustration. These examples are not intended to limit the invention in any way.

EXAMPLE 1

In the following example, a tantalum film was deposited on an absorbent glass by the technique disclosed in U.S. Pat. No. 4,166,018 discussed above. The glass was a thermally toughened float glass, 4 mm thick, of the type known in the art as "TSA$^{++}$". This material has a "traditional" silicon-sodium-calcium composition, but, in addition, iron and cobalt oxides are incorporated therein to provide coloration to the glass. The quantity of $Fe_2O_3$ was 0.80% by weight, wherein the proportion of ferrous ions to the total iron is 0.25, and the quantity of CoO was about 4 ppm by weight.

For depositing the tantalum by cathodic sputtering, a metal target comprising 99.8% tantalum was used. The target had dimensions of 21×9 cm. The installation was a laboratory installation wherein the cathode supporting the target was fixed and the 10×10 cm glass specimen was supported by a turntable having a diameter of 35 cm, which caused the specimen to pass periodically in front of the target. The minimum distance between specimen and target was 10 cm. A gas control system enabled various gases with defined flow rates to be circulated through the enclosure.

Initially, scavenging was carried out to purge the equipment and the substrate of any deposits, especially organic deposits. Then, in a first step, argon was introduced at a flow rate of 20 cm$^3$/minute prior to placing the substrate within the plasma. This volume was measured under standard temperature and pressure ("STP") conditions. The potential at the cathode was established at −280 volts. Cathodic sputtering was then carried out for 30 minutes so as to clean the target and to allow the system to equilibrate.

The turntable was then set in motion, causing the specimen to pass in front of the target, with the current becoming established at 50 mA. The specimen took 6.5 seconds to pass before the target.

On exiting the vacuum installation, the thickness of the tantalum film was measured and was found to be 5 nm. The specimen was then assessed according to various criteria. Some of these criteria relate to optical performance, while others relate to the behavior of the film on the glass. The optical criteria adopted are the light transmission "$T_L$," and the light reflection (with illuminant A) the latter being measured either on the film side, "$R_L$", generally the face which will be oriented toward the interior of the vehicle, or on the support glass side "$R'_L$". The energy transmission for solar radiation "$T_E$" was also measured. This value, i.e., "$T_E$" represents a ratio between the amount of directly transmitted solar radiation and the amount of incident solar radiation. In the present case, the following values were obtained: $T_L$=0.44, $R_L$=0.16, $R'_L$=0.05 and $T_E$=0.29.

These values are appropriate for automobile applications. In particular, it should be noted that the light transmission is relatively high by comparison with the energy transmission ($T_E/T_L$=0.66).

The mechanical behavior of the film was tested by an abrasion test, carried out with an apparatus sold by the Taber Instrument Corporation of the United States, known as a Model 174 "Standard Abrasion Tester". This tester is equipped with CS10 F grinding wheels, loaded to 500 grams.

The specimen was subjected to 1000 revolutions of the grinder and the total light transmission "τ" was measured by means of an integrating sphere before ($\tau_0$) and after ($\tau_{1000}$) abrasion. A third value, i.e., the transmission of the uncoated glass ($\tau_v$), served as a reference. The abrasion wear was designated by the letter U:

$$U = \frac{\tau_{1000} - \tau_o}{\tau_v - \tau_o}$$

Film 2 in FIG. 1, in contact with the glass substrate 1, which was tested under the foregoing conditions, demonstrated a "wear" value (U) of 0.02, which is especially low. In fact, films intended for the same application and based upon metals of atomic number from 22 to 28 exhibit, under the same conditions, a "wear" (U) of 0.40 in spite of their protection by a second, metallic oxide film. Similarly, comparing the wear value of 0.02 with the best result achieved with titanium carbide films protected by indium-tin oxide, described in U.S. Pat. No. 5,061,567 filed Nov. 30, 1989, which was still very good, it was found that their wear was nevertheless greater than 0.06.

The procedure set forth in Regulation R43, enacted by the "Economic Commission for Europe" of Geneva was used to determine the humidity resistance of the coated panes. This procedure involves maintaining the specimen for two weeks in an environment at 50° C. and 95% relative humidity. The assessment specified by the regulation is made visually. It is required that after the test, no trace of degration shall be observed. This is the case with the coating of FIG. 1. However, to make the assessment still more accurate, a comparison was made with an identical specimen before and after the test, using the same integrating sphere as above. In this way, a coefficient of degradation "D" was defined, having the following value:

$$D = \frac{\tau_H - \tau_o}{\tau_v - \tau_o}$$

Where $\tau_H$ is the total transmission of the coated specimen at the end of the test, $\tau_O$ is the same quantity at the start of the test and $\tau_v$ is the transmission of the uncoated glass.

In the case of the pane of FIG. 1, coated with tantalum, this degradation (D) was equal to 0.15. The humidity test, evaluated according to the procedure of Regulation R43 set forth above, therefore demonstrates that, in spite of the result considered as "good" according to Regulation R43, a certain degradation does exist. It is for the purpose of improving this degradation that the tantalum film is covered with a hard protective film of metal oxide.

EXAMPLE 2

In FIG. 2, a colored glass substrate 3 is schematically illustrated, which is analogous to the glass 1 of FIG. 1. Glass 3 was covered with a tantalum film 4, which was then subsequently covered with a second film 5, formed of a metallic oxide.

This second metal oxide film was deposited by a reactive cathodic sputtering technique. In the same laboratory installation as described above, a second cathode was mounted, in addition to the cathode equipped with the tantalum target. The target of the latter was, in this case, pure tin (99.9% purity).

The deposition process was carried out as follows: after a specimen of colored glass, identical in every way to that of the first example, has been introduced into the enclosure, the installation was closed and a vacuum was created therein. After scavenging and purging of the installation with argon at a flow rate of 20 cm$^3$/min STP argon, the cathode was subjected to a potential of −280 volts for 30 minutes. Tantalum was then deposited as described in the first example.

The deposition of the metal oxide film was commenced by "pre-sputtering", during which a mixture of argon and oxygen (15% oxygen) is circulated at a flow rate of 20 cm$^3$/min STP. A pressure of 1.30 Pascals was established, and then the cathode was subjected to −300 volts. During this preliminary operation, the glass was shielded. After several tens of minutes, the turntable was set in motion. During the deposition stage, the current was established at 300 mA. The rotational speed of the turntable was such that it took 3 minutes to carry out one revolution. At the end of a revolution, deposition is stopped. The SnO$_2$ film then had a thickness of 12 nm.

The specimen thus produced was subjected to the same tests as before.

The results were as follows:
$T_L$=0.43
$R_L$=0.16
$R'_L$=0.06
$T_E$=0.28
U=0.02
D=0.00

It can therefore be seen that the optical values achieved with the inclusion of a second metal oxide coating remain virtually the same as with the film of tantalum alone.

Here again, $T_E/T_L$, with a value of 0.65, constitutes a good performance index. The value for abrasion also remains similar. With regard to the value of degradation under humidity, the results are remarkable. No sign of change can be perceived after a residence of two weeks in a saturating humidity at 50° C.

Such a film may, for example, be deposited by the use of a large industrial installation which can also be used, for example, to form panes intended for building construction, having a low light reflection and natural tone, of a type particularly desired for modern buildings.

EXAMPLE 3

As in Example 1, using the same installation, a single tantalum target was used. The glass specimen was also formed of "TSA$^{+++}$" as in Example 1.

In the method of the example, the deposition time for the pure tantalum film was increased to 12 seconds, resulting in a substantially thicker, and therefore more absorbent, film. Moreover, the same target was used for producing a "reactive" tantalum oxide deposit, that is to say by adding oxygen in a proportion of 15% to the plasma-producing argon. The total flow rate was maintained at 20 cm$^3$/min STP. The rotational speed for the turntable was four minutes for one revolution. Only one pass was made past the target. Analysis of the films showed that there was a metallic tantalum film of 9 nm thickness, over which was superimposed an oxide film 12 nm in thickness. A specimen was obtained having the following values:
$T_L$=0.35
$R_L$=0.19
$R'_L$=0.10
$T_E$=0.24
$T_E/T_L$=0.69

A measurement was also made of the color, in transmission and in reflection, at the glass side of the glazing for comparison with that of a specimen of colored TBA$^{++}$ glass. In effect, when it is desired to produce the "dark tail" concept on an automobile, it is important that the appearance of the different panes following one another from front to rear of the vehicle should not be too different from one another. This parameter is especially important with regard to the reflection from the glass side, because it is this characteristic which will give the overall impression concerning the appearance of the vehicle. It is important for the reflection intensity value to remain close to that of the color intensity.

In addition to the value of $R'_L$ mentioned above, the dominant wave-length $\lambda'_D$(nm) and the purity factor P' (%) were also measured. In transmission, one is clearly compelled to accept an evolution of the light transmission $T_L$ which necessarily evolves with the energy transmission $T_E$ which, by this principle, decreases from front to rear of a vehicle having the "dark tail" look, but the color characteristics measured by $\lambda_D$ and P, also must not change too much from one pane to the next.

The results obtained for the pane of Example 3, intended for forming, for example, a rear lateral window pane, and the uncoated TSA$^{++}$ glass of 3 mm thickness, which will be used for the front door, may be compared as follows:

|  | R'L | $\lambda'_D$ | P' | $T_L$ | $\lambda_D$ | P |
|---|---|---|---|---|---|---|
| TSA$^{++}$+Ta+Ta$_2$O$_5$ | 0.10 | 486 | 10 | 0.35 | 594 | 4 |
| TSA$^{++}$ | 0.07 | 491 | 3.5 | 0.74 | 503 | 2.5 |

These results are in close agreement. That is, the reflected color is exactly the same, there is little difference in the reflection coefficients and the purity factor remains limited. With regard to transmission, the tint with a very low purity (i.e., less than or equal to 4%) remains neutral.

EXAMPLE 4

The pane of Example 4 is not intended to be fitted to the lateral or rear windows of an automobile having the "dark tail" look, but rather it is used to form a transparent roof for the vehicle.

This panel is produced from the same basic glass and in the same installation as that of Example 3, but with different adjustments. That is, the metallic tantalum film is much thicker in the present case (25 nm) but the protective film of Ta$_2$O$_5$ has the same thickness as in the previous example, i.e., 12 nm.

The characteristics of the coated glazing are:

$T_L$=0.09
$R_L$=0.43
$R'_L$=0.30
$T_E$=0.07
$\lambda'_D$=493 nm
P'=7%
$\lambda_D$487 nm
P=7%

Apart from a clearly higher reflection, the external appearance, i.e., the color, is very close to that of the glass by itself.

EXAMPLE 5

A specimen of standard clear float glass having a thickness of 4 nm was used. The glass was placed in the magnetron cathodic sputtering installation of Example 1.

Using the same tantalum target as before, deposition was carried out under the same conditions (–280 volts, 500 mA). The deposition time utilized was also the same as that used in Example 1.

When the tantalum deposition was completed, the specimen was removed from the cathodic sputtering installation and introduced into a vapor phase chemical deposition (CVD) installation. The method used was conventional, i.e., as described in European Patent Application EP 335 769. The specimen was raised to a temperature of 250° C. and a mixture of argon, oxygen and diethyl zinc having the following flow rates was introduced into the enclosure:

1.3 cm$^3$/min. of (C$_2$H$_5$)$_2$Zn 600 cm$^3$/min. argon and 13 cm$^3$/min. oxygen.

The pressure in the enclosure was maintained at 13,000 Pascals. After 60 seconds, deposition was stopped. When the specimen was removed, its optical characteristics were measured.

The thicknesses of the successive films was 5.5 nanometers for the tantalum and 12 nanometers for the zinc oxide. The optical characteristics were as follows:

$T_L$=0.35
$T_E$=0.40
$R_L$=0.24
$R'_L$=0.11

In the foregoing examples, the subject coatings were deposited upon a highly colored green TSA$^{++}$ glass (in the first four examples) and a standard clear glass (in Example 5). Satisfactory results are, however, as noted above, also obtainable with the use of glass types conventionally used for manufacturing automobile panes, such as "TSA" or "TSA standard" glass. This glass is also green and has a chemical composition as described above. The bronze glass known as TFA can also serve as an excellent support for the films of this invention.

Of the five examples described above, the first four use cathodic sputtering while the fifth combines this method with CVD. Other vacuum or chemical methods may, however, be used as well. Thus, the tantalum film may also be deposited by, for example, vacuum evaporation (thermal or by electron gun), while for the deposition of the metal oxide protective films, apart from the reactive cathodic sputtering and the CVD processes already mentioned, non-reactive cathodic sputtering may also be used—for example from a fritted ITO target—or else a plasma-CVD technique analogous to that described in U.S. Pat. No. 5,112,675 can also be used. Where the tantalum is deposited by a cathodic sputtering technique, such as for example with magnetic confinement of an argon plasma, the use of the same technique with the same target, but in this case with reactive sputtering in the presence of oxygen, enables an outer layer of tantalum oxide to be readily deposited under particularly simple conditions.

Thus the invention makes it possible to provide coated glass panes which substantially decrease the energy transmission of a single-sheet glass, while at the same time having a very similar appearance in reflection to that of the other panes of an automobile vehicle. In the case of laterally oriented automobile panes, the reflection is low, and, in all cases, the resistance to abrasion and to humidity are very good. Such panes can find many applications, such as for windows for buildings and as windows for automobiles.

While it is apparent that the invention herein disclosed is well calculated to fulfill the objects above stated, it will be appreciated that numerous modifications and embodiments may be devised by those skilled in the art and it is intended that the appended claims cover all such modifications and embodiments as fall with the true spirit and scope of the present invention.

We claim:

1. A solar protection glazing adapted for reducing the amount of solar energy transmitted therethrough and having a light transmission in the visible spectrum of about 44% or less, said glazing consisting essentially of:

a glass pane;

a first film of tantalum metal having a thickness of between about 2–30 nm directly coated on at least a portion of the glass pane; and a second film of a metal oxide having a thickness of greater than about 10 nm but less than about 40 nm, said metal oxide selected from at least one of the group consisting of tin oxide, indium oxide, zinc oxide, antimony oxide, and cadmium oxide, and being deposited on at least a portion of the first film;

wherein one side of the first tantalum metal film is in direct contact with the glass pane and the other side is in direct contact with the second metal oxide film.

2. The glazing of claim 1 wherein said tantalum film has a thickness of between about 4.5–6.5 nm.

3. The glazing of claim 1 wherein said tantalum film has a thickness of between about 22–28 nm.

4. The glazing of claim 1 wherein the glass substrate is colored.

5. The glazing of claim 4 wherein the glass substrate comprises TSA, $TSA^{++}$ or TFA glass.

6. The glazing of claim 1 wherein the light transmission is 35% or less.

7. The glazing of claim 1 wherein the light transmission is 10% or less.

8. The glazing of claim 1 wherein the ratio of light transmission to energy transmission is less than 0.7.

9. A solar protection glazing adapted for reducing the amount of solar energy transmitted therethrough and having a light transmission in the visible spectrum of about 44% or less, said glazing consisting essentially of:

a glass pane;

a layer of tantalum metal having a thickness of between about 2–30 nm directly coated on at least a portion of the glass pane; and a layer of a metal oxide having a thickness of greater than about 10 nm but less than about 40 nm, said metal oxide selected from at least one of the group consisting of tin oxide, indium oxide, zinc oxide, antimony oxide, and cadmium oxide, and being deposited on at least a portion of the tantalum metal layer;

wherein one side of the tantalum metal layer is in direct contact with the glass pane and the other side is in direct contact with the metal oxide, and the glazing has a ratio of light transmission to energy transmission of less than 0.7.

10. The glazing of claim 9 wherein said tantalum layer has a thickness of between about 4.5–6.5 nm.

11. The glazing of claim 9 wherein said tantalum film has a thickness of between about 22–28 nm.

12. The glazing of claim 9 wherein the glass substrate is colored.

13. The glazing of claim 9 wherein the light transmission is 35% or less.

14. The glazing of claim 13 wherein the glass substrate comprises TSA, $TSA^{++}$ or TFA glass.

15. The glazing of claim 9 wherein said tantalum layer has a thickness of between about 22–28 nm.

16. A solar protection glazing for reducing the amount of solar energy transmitted therethrough and having a light transmission in the visible spectrum of about 44% or less, said glazing consisting of:

an uncoated glass pane;

a layer of tantalum metal having a thickness of between about 2–30 nm directly coated upon and in direct contact with at least a portion of one side of the glass pane; and a layer of a metal oxide having a thickness of greater than about 10 nm but less than 40 nm, said metal oxide selected from at least one of the group consisting of tin oxide, indium oxide, zinc oxide, antimony oxide and cadmium oxide, and being deposited directly upon and in direct contact with the tantalum metal layer.

17. The glazing of claim 16 which has a ratio of light transmission to energy transmission of less than 0.7.

18. The glazing of claim 16 wherein the glass substrate comprises TSA, TSA++ or TFA glass.

19. The glazing of claim 16 wherein said tantalum layer has a thickness of between about 4.5–6.5 nm.

20. The glazing of claim 16 wherein said tantalum layer has a thickness of between about 22–28 nm.

21. The glazing of claim 16 wherein the glass substrate is colored.

22. The glazing of claim 16 wherein the light transmission is 35% or less.

23. The glazing of claim 22 wherein the glass substrate comprises TSA, TSA++ or TFA glass.

24. The glazing of claim 16 wherein the light transmission is 10% or less.

* * * * *